United States Patent
Petzold et al.

(10) Patent No.: US 7,336,739 B2
(45) Date of Patent: Feb. 26, 2008

(54) CROSS-CORRELATION SIGNAL DETECTOR

(75) Inventors: Karen E. Petzold, Tioga Center, NY (US); Stephen C. Smith, Vestal, NY (US)

(73) Assignee: Lockheed Martin Corporation, Bethesda, MD (US)

(*) Notice: Subject to any disclaimer, the term of this patent is extended or adjusted under 35 U.S.C. 154(b) by 830 days.

(21) Appl. No.: 10/672,224

(22) Filed: Sep. 26, 2003

(65) Prior Publication Data
US 2005/0069061 A1    Mar. 31, 2005

(51) Int. Cl.
*H03D 1/00* (2006.01)
*H04L 27/06* (2006.01)

(52) U.S. Cl. .................. 375/343; 375/142; 375/150; 704/218

(58) Field of Classification Search ............ 375/142, 375/150, 343; 708/218
See application file for complete search history.

(56) References Cited

U.S. PATENT DOCUMENTS

| | | | |
|---|---|---|---|
| 3,623,097 A | 11/1971 | Femenias | |
| 4,567,588 A | 1/1986 | Jerrim | |
| 4,608,701 A | 8/1986 | Burgers et al. | |
| 4,637,067 A | 1/1987 | Steinberger | |
| 4,942,589 A | 7/1990 | Smith et al. | |
| 4,956,644 A | 9/1990 | Leahy et al. | |
| 5,371,760 A | 12/1994 | Allen et al. | |
| 5,694,416 A | 12/1997 | Johnson | |
| 5,724,383 A | 3/1998 | Gold et al. | |
| 5,790,591 A | 8/1998 | Gold et al. | |
| 5,841,400 A * | 11/1998 | Hiramatsu | 342/382 |
| 5,982,763 A | 11/1999 | Sato | |
| 6,011,812 A | 1/2000 | Laakso et al. | |
| 6,058,138 A | 5/2000 | Fukumasa et al. | |
| 6,061,390 A | 5/2000 | Meehan et al. | |
| 6,078,573 A | 6/2000 | Batalama et al. | |
| 6,178,197 B1 * | 1/2001 | Froelich et al. | 375/150 |
| 6,246,884 B1 | 6/2001 | Karmi et al. | |
| 6,304,620 B1 | 10/2001 | Rouphael | |
| 6,430,208 B1 | 8/2002 | Fullerton et al. | |
| 6,717,992 B2 * | 4/2004 | Cowie et al. | 375/316 |
| 7,103,339 B2 * | 9/2006 | Sternberg | 455/264 |
| 2001/0036221 A1 | 11/2001 | Sato | |
| 2001/0050950 A1 | 12/2001 | Sato | |
| 2002/0136277 A1 | 9/2002 | Reed et al. | |
| 2002/0159537 A1 | 10/2002 | Crilly | |
| 2002/0169601 A1 * | 11/2002 | Nishio | 704/205 |

* cited by examiner

*Primary Examiner*—Jay K. Patel
*Assistant Examiner*—Curtis B. Odom
(74) *Attorney, Agent, or Firm*—Tarolli, Sundheim, Covell & Tummino LLP (57) ABSTRACT

A method, system, and computer program product are provided for detecting at least one signal of interest within an input signal. At least one set of samples from the input signal is multiplied by at least one set of samples representing a complex conjugate of the input signal to obtain a series of correlation samples. Sets of one or more consecutive correlation samples are summed to obtain a series of pulse sums. A plurality of non-consecutive pulse sums are integrated to obtain a search value.

17 Claims, 4 Drawing Sheets

CROSS-CORRELATION SIGNAL DETECTOR

BACKGROUND OF THE INVENTION

1. Technical Field

The invention relates generally to broadcast signal receivers and, more specifically, to a system for detecting broadcast signals having a low or negative signal-to-noise ratio.

2. Description of the Prior Art

It is often desirable to detect a signal having a low or even negative signal-to-noise ratio. For example, a radio beacon on a downed aircraft may provide a faint radio signal that is overshadowed by background radio noise. Similarly, a signal from a communication device such as a cellular phone might be masked by noise at the edge of a specified coverage area. Such signals are particularly difficult to detect or analyze, as most attempts to amplify the weak signal will also amplify the accompanying noise. If the signals can be detect amid all of the noise, however, it may be possible to retrieve the signal from a buffer or determine the location of the source.

In other applications, a signal is made intentionally weak to avoid interception. For example, in a low probably of intercept (LPI) radar system, the signal is intentionally maintained at low power in an attempt to mask the signal with background noise. Even when general characteristics of the radar signal are known, conventional radar detectors cannot detect or analyze this weak signal to determine the position of the radar. Accordingly, it can be difficult to neutralize an LPI radar unless the radar transceiver is located by other, less dependable means.

SUMMARY OF THE INVENTION

In accordance with one aspect of the present invention, a method is provided for detecting at least one signal of interest within an input signal. At least one set of samples from the input signal is multiplied by at least one set of samples representing a complex conjugate of the input signal to obtain a series of correlation samples. Sets of one or more consecutive correlation samples are summed to obtain a series of pulse sums. A plurality of non-consecutive pulse sums are integrated to obtain a search value.

In accordance with another aspect of the invention, a cross-correlation detection system includes a digital multiplier that multiplies at least one set of samples from the input signal by at least one set of samples representing a complex conjugate of the input signal. This multiplication produces a series of correlation samples. At least one digital integrator sums sets of one or more consecutive correlation samples to obtain a series of pulse sums. A digital signal processor then integrates a plurality of non-consecutive pulse sums to obtain a search value.

In accordance with yet another aspect of the invention, a computer program product, operative in a data processing system, detects at least one signal of interest within an input signal. The system includes a digital multiplication function that multiplies at least one set of samples from the input signal by at least one set of samples representing a complex conjugate of the input signal. This digital multiplication produces a series of correlation samples. At least one integration function sums sets of one or more consecutive correlation samples to obtain a series of pulse sums. A search function integrates a plurality of non-consecutive pulse sums to obtain a search value.

BRIEF DESCRIPTION OF THE DRAWINGS

The foregoing and other features of the present invention will become apparent to one skilled in the art to which the present invention relates upon consideration of the following description of the invention with reference to the accompanying drawings, wherein.

DETAILED DESCRIPTION OF THE INVENTION

In accordance with the present invention, a method and system for detecting a one or more signals of interest within an input signal is disclosed. The invention can be applied to any of a number of signal detection applications where, such as detecting radar emissions, locating individuals or vehicles in search and rescue operations, or for locating weak or corrupted signals within a buffer for signal enhancement applications. It will be appreciated that the present invention can be applied even to signals having a negative signal-to-noise ratio to retrieve information concerning signals of interest.

The present invention can be implemented, at least in part, as one or more software programs. Therefore, the structures described herein may be considered to refer either to individual modules and tasks within a software program or as an equivalent hardware implementation.

The present invention can be designed to detect any signal displaying a stable periodicity. For example, the present invention can be used to detect a signal comprising a series of evenly spaced pulses. In another application, the received signal can be a continuous wave, frequency modulated, ramp signal that cycles through a range of frequencies at a constant rate. While the exemplary embodiments discussed herein focus on these two signal types, it will be appreciated that the signal detection system of the present invention can be adapted to detect signals having similar periodic behavior.

Figure 1:
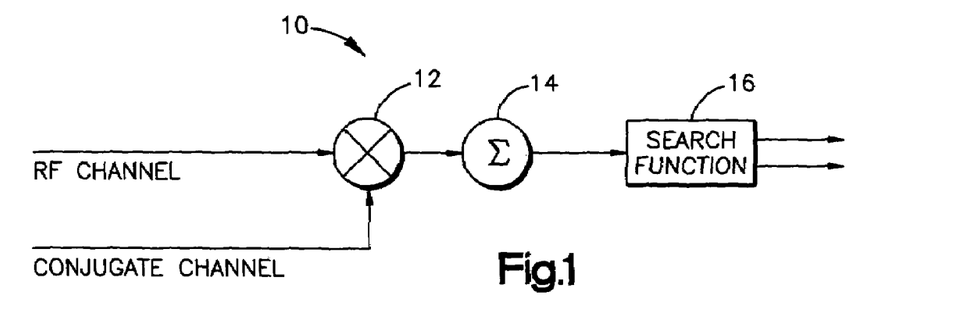
FIG. 1 illustrates a signal detection system in accordance with one aspect of the present invention.

FIG. 1 illustrates a signal detection system 10 for detecting one or more signals of interest within an input signal in accordance with one aspect of the present invention. The input signal is received as one input to a digital multiplier 12. It will be appreciated that the digital multiplier 12 can be implemented as a stand-alone digital hardware component, as a software program running on a computer processor, or as any other suitable mechanism for multiplying two signals. A second signal, representing a complex conjugate of the input signal, is received as a second input to the digital multiplier 12. The output of the multiplier 12 is a sampled, analytical signal representing the complex product of the two signals.

The output of the multiplier 12 is provided to one or more integrators 14. Like the digital multiplier 12, the integrators 14 can be implemented as digital hardware components, as a software program on a computer processor, or as any other suitable mechanism for summing the samples output from the multiplier. The integrator 14 sums series of consecutive samples within the multiplier output to form one or more sets of pulse sums. The length of each series of consecutive samples will depend on known or estimated properties of the signals of interest. Each pulse sum can have an associated start time related to the sample time of the first sample in the consecutive series.

The one or more sets of pulse sums are provided to a search function 16. The search function can be implemented as a digital signal processor, as a computer program operable in a data processing system, or as any other suitable signal processing means, including specialized digital hardware. The search function integrates sets of non-consecutive pulse sums to determine a search value.

In an exemplary embodiment, the search function 16 can select an initial pulse sum for the integration process according to an associated start delay value. The start delay value indicated the start time of a pulse sum at which to begin the integration. Similarly, the search function 16 can select a pulse repeat interval that specifies a constant amount of time between the start times of the pulse sums within the series. Thus, when a start delay and pulse repeat interval have been specified, the search function 16 will have a predetermined starting point for the integration, and will future pulse sums having a start time equal to the sum of the start delay and an integer multiple of the pulse repeat interval.

The search function 16 can generate multiple search values, each having an associated pulse repeat interval and start delay. In an example embodiment, a plurality of search values are generated and searched for peak values. For example, the search values can be compared to a predetermined threshold value. Where a search value is determined to be a peak value, its associated start delay value and pulse repeat interval provide information as to a signal of interest. This information can be used to retrieve the signal from a buffer or determine phase and amplitude values associated with the signal. In an exemplary embodiment, the system is implemented within an interferometer, and the signal information can be used to determine a direction associated with the signal source.

Figure 2:
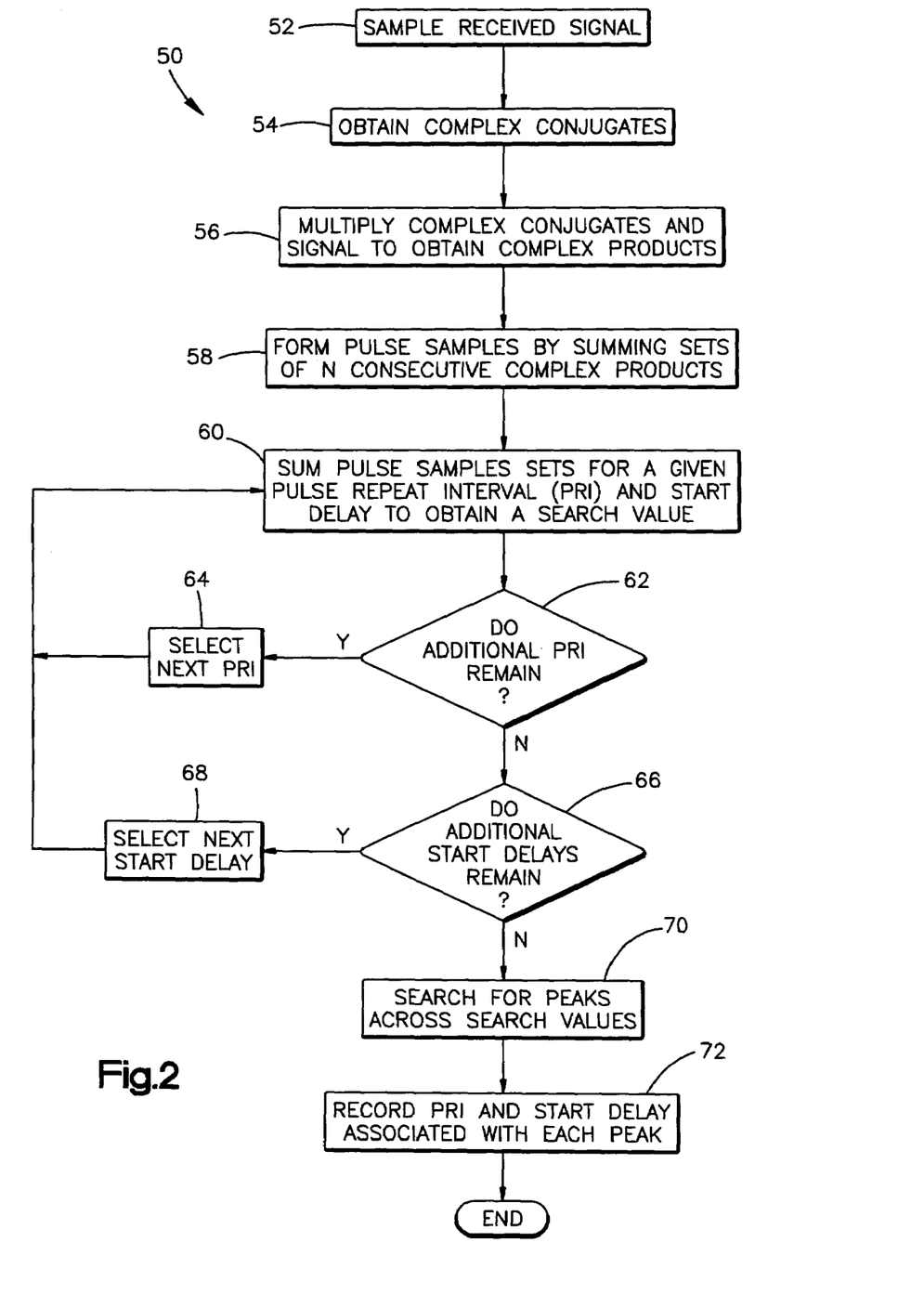
FIG. 2 illustrates a methodology for detecting a signal of interest within a received input signal.

FIG. 2 illustrates an exemplary methodology 50 for detecting a signal of interest within a received input signal. At block 52, an input signal received at a plurality of antennas is sampled to form a plurality of signal sample sets. In an exemplary embodiment, the antennas are spaced apart from one another in an interferometer arrangement. Each set of signal samples represents the input signal, but the differing locations of the antenna will cause differences in phase between the signal sample sets. At block 54, the complex conjugate of one or more of the plurality of signal sample sets is formed.

The process continues at block 56, where one or more of the signal sample sets is multiplied by the complex conjugate of one or more other signal sample set to produce a series of correlation samples. Collectively, the correlation samples represent one or more base-band signals of interest as well as a number of high-frequency signals representing noise within the original signal.

At block 58, the system creates a plurality of pulse sums by summing sets of one or more consecutive correlation samples. The number of correlation samples included in each pulse sum will be a function of the expected pulse durations of the signals of interest. For example, if a signal of interest is believed to have a pulse duration approximately equal to three intersample intervals, the pulse sum will comprise three samples. A pulse sum is generated for every possible set of consecutive correlation samples. Thus, each pulse sum has an associated start time and duration according to the series of consecutive correlation samples comprising it.

It will be appreciated that the start time and duration of a pulse sum can be measured not only in absolute units of time, but relative to the rate at which the input signal was sampled. For the sake of convenience, the start time of a pulse sum will often be measured as a sample time, a number reflecting the position of the first sample within the sequence of consecutive correlation samples comprising the pulse sum. Similarly, the duration of a pulse sum would be equal to the number of correlation samples comprising the pulse sum. For example, a pulse sum generated from the fifth, sixth, and seventh correlation samples within a set of correlation samples would begin at a sample time of five and have a duration of three sample intervals.

For some signals, it may not be possible to accurately predict a pulse duration for the signal of interest. For example, when evaluating a frequency modulated ramp signal, the duration of the "pulse" within each channel will depend on the rate of change in frequency across the ramp. Generally, however, the expected pulse duration can be estimated as one of several discrete values. Similarly, when there are multiple signals of interest, each can have one or more candidate pulse durations. Accordingly, a pulse sum set can be generated for each possible pulse length, and all of these sets can be provided to the search function. This allows the search function to account for uncertainty in the expected pulse duration by varying the duration of the pulse sums.

At block 60, a plurality of non-consecutive pulse sums are integrated according to a given start delay and pulse repeat interval to create a search value. Each search value is calculated by determining an initial sample time from the given start delay. The integration begins when the pulse sum beginning at the determined sample time is selected and added to a running total. A value equal to the pulse repeat interval is then added to the determined sample time to determine a second sample time. The pulse sum beginning with the second sample time is then selected and added to the running total. This process continues until a predetermined number of pulse sums, each separated in time by the given pulse repeat interval, have been added to the running total. The running total is then saved to memory as a search value associated with the given start delay and pulse repeat interval.

At block 62, the system determines if there are any pulse repeat intervals left to be evaluated by the system. In general, some information will be available about the pulse duration and pulse repeat value of the signal of interest. For example, a range of pulse repeat values can generally be determined for a particular application. The system searches for a particular pulse repeat interval across this limited range of values.

Although the range of pulse repeat intervals is a continuous interval, for the purposes of the search function, it is unnecessary to examine pulse repeat intervals at time increments any finer than individual sample intervals. Accordingly, the range of pulse repeat intervals can be reduced to a series of discrete intervals measured in multiples of the intersample interval. In an exemplary embodiment, the pulse repeat intervals vary by one sample interval, but depending on the extent of the pulse repeat interval range, it can be desirable to vary the pulse repeat intervals by values greater than one intersample interval. The search function evaluates each of these intersample intervals once for each start delay value.

If it is determined at block 62 that additional pulse repeat intervals remain for evaluation, the process advances to block 64, where a new pulse repeat interval is selected. The process then returns to block 60 to calculate a search value associated with the new pulse repeat interval. If it is determined that all of the pulse repeat intervals have been evaluated, the process advances to block 66.

At block 66, it is determined if any start delay values remain for evaluation. Like the pulse repeat intervals, the start delay values can considered as discrete values within a predetermined range. Each start delay value can thus represent a particular correlation sample at which the integration process will begin. A logical limit for the start delay is the maximum pulse repeat interval value. The start delay values can proceed by increments of one or more intersample intervals from zero to the maximum pulse repeat interval.

If it is determined that start delay values remain to be evaluated, the process advances to block 68, where a new start delay value is selected. The process then returns to block 60 to calculate a search value associated with the new start delay value. If it is determined that all of the start delay values have been evaluated, the process advances to 70.

At block 70, the search values are searched for peak values. By peak value, it is meant a value sufficiently large to indicate the presence of a signal having a pulse repeat interval and start delay associated with the search value. In one implementation, peaks are determined as one or more of the largest available values. The range of search values can be searched across their associated start delay values and pulse repeat intervals until the optimal values are determined. Alternatively, any pulse repeat value greater than a predetermined threshold can be taken as a peak value.

At block 72, the start delay value and pulse repeat value for each peak is recorded. These values provide information as to characteristics of any signals of interest. For example, a phase value associated with two or more antennas can be calculated and used to determine the angle of arrival for a signal. Alternatively, the two values can be used to locate a signal of interest within a signal buffer, allowing further processing of the signal. It will be appreciated that the detection of signals of interest through a substantial amount of noise can be applied in numerous other ways beyond those described herein.

Figure 3:
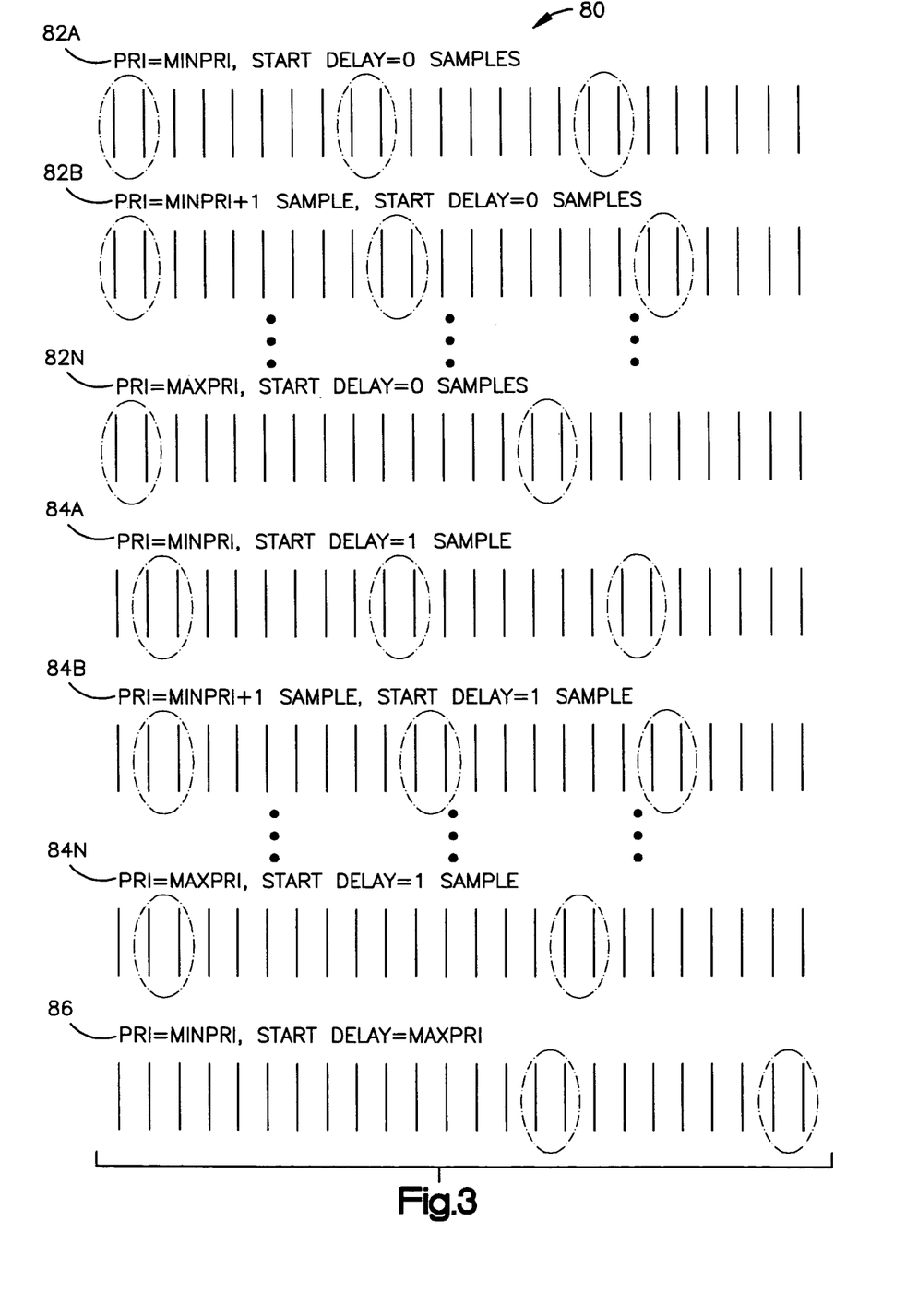
FIG. 3 is a graphical representation of an exemplary search process in accordance with an aspect of the present invention.

FIG. 3 illustrates a graphical representation 80 of an exemplary search process in accordance with an aspect of the present invention. It will be appreciated that the graphical representation 80 is simplified considerably for the purposes of explanation. For each diagram, it is assumed that the expected pulse durations of the signals of interest are constant and approximately equal to two sample widths. Thus, each pulse sum will comprise two samples. The first three diagrams 82A, 82B, and 82N illustrate several evaluations of various pulse repeat intervals over a constant initial start delay of one sample interval.

In the first diagram 82A, the pulse repeat interval is selected as a minimum pulse repeat interval equal to eight sample intervals. It will be appreciated that the illustrated minimum and maximum pulse repeat intervals are selected solely for the convenience of explanation. Appropriate minimum and maximum pulse repeat intervals for a particular application will be known or estimated prior to the operation of the system. Since the start delay is equal to one sample, the pulse sum beginning at the first correlation sample will be selected and added to a running total. For a pulse repeat interval of eight sample intervals, the pulse sum beginning at a sample time of nine would also be selected for addition to the total. This would continue in increments of eight sample intervals until a predetermined number of pulse sums is reached. The final total would be saved in memory as a search value associated with the start delay value and the pulse repeat interval.

After a value associated with the first pulse repeat interval has been determined, a new pulse repeat interval is selected for evaluation. The second diagram 82B, illustrates the evaluation of the signal for an identical start delay of one sample interval, but the pulse repeat interval is incremented upward by one sample interval. Again, the pulse sum associated with the first correlation sample is selected, but now the pulse sum beginning at a sample time of ten will be selected for addition to a running total. The search function will continue to add the pulse sum beginning at each ninth correlation sample until the predetermined number of pulse sums is reached. The final total is saved in memory as a search value, and the pulse repeat interval is incremented again.

The search function continues through a set of available pulse repeat intervals until a maximum pulse repeat interval is reached. Once the signal is evaluated at the maximum pulse repeat function, the start delay value is incremented and the search function will evaluate each of the various pulse repeat intervals for the new start delay value. The fourth, fifth, and sixth diagrams 84A, 84B, and 84N illustrate a second loop through the range of pulse repeat intervals at a start delay of one sample. The start delay values will continue to increment until a maximum delay value, equal to the maximum pulse repeat interval, is reached, as is illustrated in the seventh diagram 86. Once the signal is evaluated at each pulse repeat interval for the maximum start delay, the process terminates and the peak search values are located.

Figure 4:
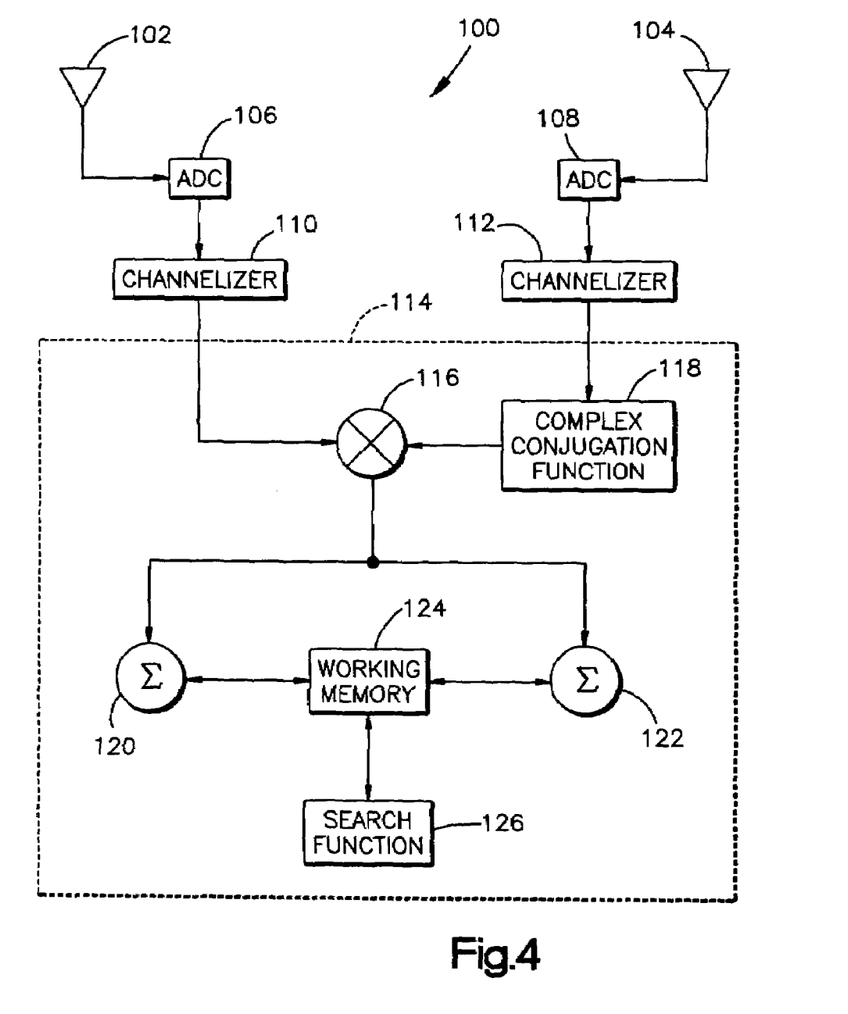
FIG. 4 illustrates an exemplary implementation of the present invention.

FIG. 4 illustrates an example implementation of the present invention. In the illustrated example, an embodiment of the present invention is utilized in an interferometer arrangement having two antennas. It will be appreciated, however, that the present invention may be used to for signal detection in other applications, including applications requiring more than two antennas.

In the illustrated system 100, an input signal containing one or more signals of interest is received at a first antenna 102 and a second antenna 104. The first antenna 102 is located a known distance from the second antenna 104. The spacing of the antennas will cause a slight time delay in reception between the antennas, the amount of delay depending on the location of the source of the signal. In the example implementation, the spacing between the antennas is chosen to maintain a time delay less than a predetermined sample interval. It will be appreciated that the input signal received at the antennas 102 and 104 can comprise signals from multiple sources, but the input signal will appear to the system, at least initially, as a single signal.

The signals received at the first and second antenna are digitized at respective first and second analog-to-digital converters 106 and 108. The digitized signals are then filtered and provided to respective first and second digital channelizers 110 and 112 for channelization. The output of the channelizer is a sampled, complex, discrete time signal.

The details of the channelization will depend on the nature of the signal. For example, where the signal is a pulsed signal having a roughly constant pulse duration, the digitized signals will be provided as large bandwidth channels (e.g., 64 MHz) centered on the radio frequency of the incoming signal. For the frequency modulated ramp signal of the illustrated example, each channel will contain a narrow "slice" (e.g., 1 MHz) of a frequency modulated ramp representing a predetermined frequency band. Accordingly, each channel in the signal bandwidth will contain pulses having a pulse duration and repeat interval depending on the rate of frequency increase in the signal. Since the frequency ramp repeats after the completion of each cycle, the pulse repeat interval (PRI) of each channel is dependent on the interval between successive frequency modulated sweep cycles.

The output of the first and second channelizers 110 and 112 is provided to a cross-correlation detector 114 according to one aspect of the present invention. In the illustrated example, the cross-correlation detector 114 is implemented as software on a general-purpose digital computer. Alternatively, one or more functions of the detector may be provided as specialized hardware components.

A channel from the first channelizer is provided to a digital multiplication function 116. A corresponding channel from the second channelizer is provided to a complex conjugation function 118 that generates the complex conjugate of the channel. The output of the complex conjugation function is also provided to the digital multiplication function 116. The digital multiplier function outputs a product expressed as two signal components, a real in-phase component, and an imaginary quadrature component. The resulting output comprises a base-band signal with an amplitude approximately the square of the amplitude of the original signal, and a set of lower amplitude, high-frequency terms.

The real and imaginary components resulting from the digital multiplication are passed, respectively, to first and second integration function 120 and 122. Each integration function sums sequences of one or more adjacent samples of the received component, according to the estimated pulse duration of signal of interest (e.g., the effective pulse width), to obtain a series of pulse sums. In the example embodiment, a sample interval is selected such that the expected pulse duration of the signal is greater than two sample intervals. The integration functions 120 and 122 integrate (i.e., sum) every possible N-length sequence of consecutive samples and store the result in a working memory 124. For example, if N is equal to three, the first three samples would be summed as a first pulse sum, the second through fourth signal samples would be summed to form a second pulse sum, and so forth. Each pulse sum will have an associated start time based upon the position of the first sample within the sequence.

The variable N is programmable to assume one or more integer values, each corresponding to one of a set of estimated pulse durations. The value of N can be varied within the algorithm to account for uncertainty in the expected pulse duration of the signal. For example, where a dependable estimate of the signal pulse duration is available, N will assume a constant value through the algorithm. For the frequency modulated ramp signal of the illustrated example, however, the pulse duration of the channeled signal will vary with the rate of frequency change in the original signal. Thus, integrated pulse sums corresponding to multiple values of N are generated to account for several candidate pulse duration values.

The in-phase and quadrature components of the signal are then combined to convert the signal to a magnitude/phase form and input into a search function 126. The search function 126 determines a start delay and pulse repeat interval associated with the input signal. The search function sums series of non-consecutive pulse sums to obtain pulse values. The non-consecutive pulse sums are selected according to one of a plurality of start delay values and pulse repeat interval values contained within respective sample sets. The values of the pulse repeat intervals will vary with the expected rate of change in the periodic frequency modulated signal.

In the example embodiment, the sample set of pulse repeat interval values vary incrementally from a minimum pulse repeat interval to a maximum pulse repeat interval. The minimum pulse repeat interval corresponds to a maximum expected signal ramping rate of the frequency modulated ramp signal. The maximum pulse repeat duration corresponds to a minimum expected signal ramping rate. The sample set of start delays will vary with the pulse repeat interval. In the exemplary embodiment, the available start delays will range from a delay of one sample to a delay equal to the maximum expect pulse repeat interval.

The search function 126 creates a two-dimension surface defined by search values varying over the sample sets of pulse repeat intervals and start delays. For a given pulse repeat interval, and start delay, the search value, V, can be expressed as follows:

$$V(P, m) = \sum_{j=0}^{MaxItr} X(m + jP(i))$$

where m is the start delay measured in sample intervals, P(i) is the $i^{th}$ pulse repeat interval within the sample set, MaxItr is a maximum number of pulse sums included in the search value, and X(u) is the value of the pulse sum with a start time of u (i.e. beginning with the $u^{th}$ sample).

The search function 126 determines the locations of peaks within the chart of sample values. In the exemplary embodiment, a peak is defined as any search value crossing a predetermined threshold. Alternatively, a predetermined number of maximum search values could be selected as peaks. For each selected peak, the pulse repeat interval and start delay associated with the peak search value are considered to describe a received signal. Once the start delay and pulse repeat interval of a received signal are known, the phase of the signal can be determined and used to calculate the angle of arrival of the signal.

Figure 5:
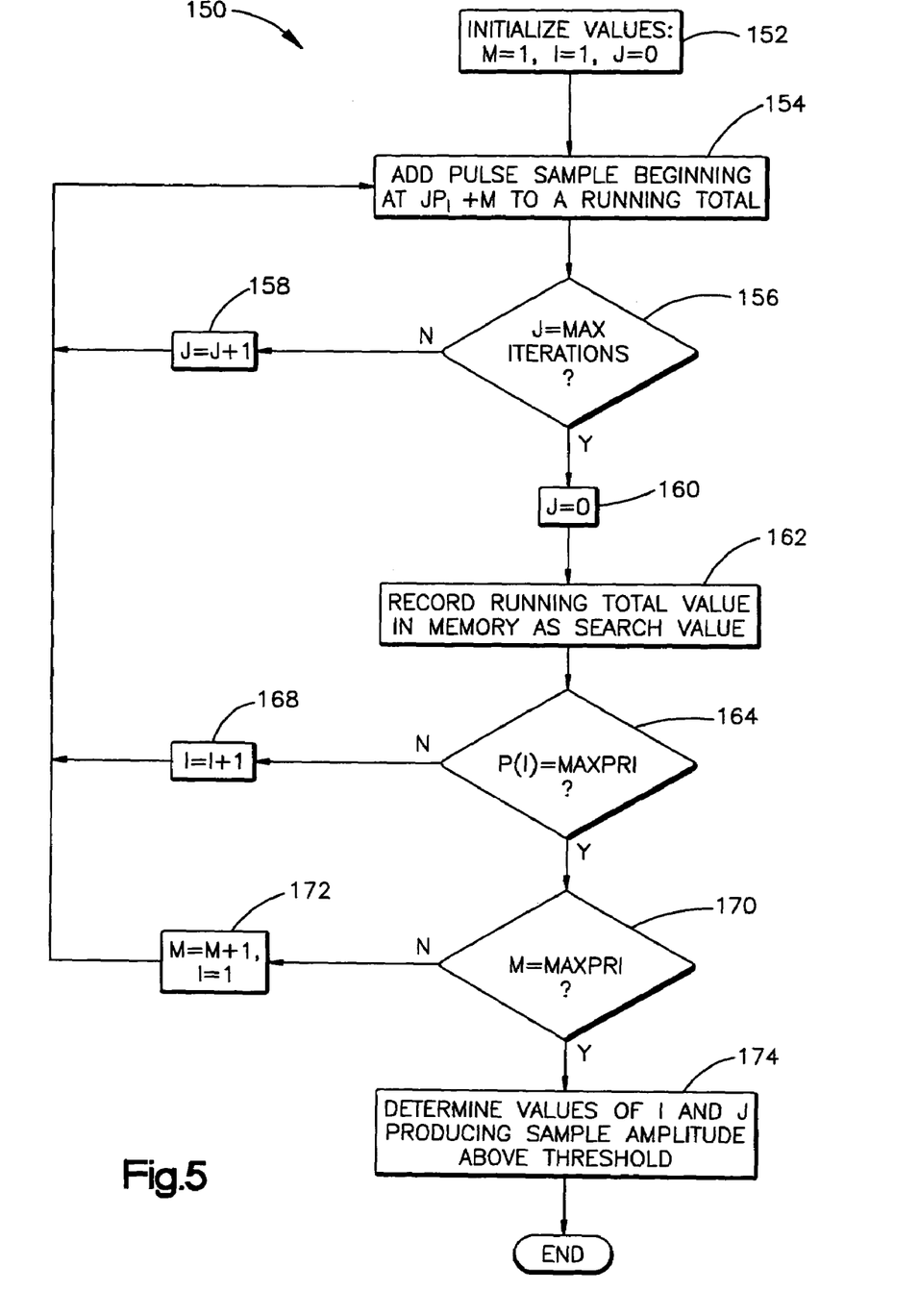
FIG. 5 illustrates an exemplary implementation of the search process as a flow diagram.

FIG. 5 illustrates an exemplary implementation of the search process as a flow diagram. In the exemplary implementation, it is assumed that the expected pulse duration of the signal of interest is constant and that a single pulse sum set has been provided to the search function. The search process begins at block 152 by initializing a first counter, M, to indicate the first of the series of samples and an indexed value, P(i), to indicate a minimum expected value for the pulse repeat interval (i.e. i is set to 1). A value j is also set to zero. The values M and P are normalized variables representing the start delay and the pulse repeat interval respectively. M and P are measured as integer numbers of samples, and can be translated to their respective physical values via multiplication by the sample rate. It is assumed that estimates of a minimum and a maximum value for the pulse repeat interval will be available for a particular application.

The search function sums the values according to the selected start position, M, and the selected pulse repeat interval, P(i). At block 154, the search function then adds the complex value of the pulse sum beginning at sample J*P(i)+M to a running total. The system then proceeds to decision block 156, where it is determined if the pulse sum set has been integrated across a predetermined number of pulse repeat intervals. If not, a counter reflecting the number of pulse repeat intervals used, N, is incremented upward by one at block 158, and the system returns to block 154 to add another pulse sum to the total. For each successive cycle through step 154, a pulse sum beginning N(i) spaces from the last selected pulse sum is selected, with N(i) corresponding to a selected pulse repeat interval. Thus, the sample time of each selected pulse sum will be equal to (J*N(i)+M).

When J reaches a maximum value, the process advances to block 160, where J resets to zero. The maximum value for J will be determined by a desired number of pulse repeat intervals over which sample pulse will be integrated. Increasing the number of pulse repeat intervals included in the integration will further increase the accuracy of the search function at the cost of processing time.

The process then advances to block 162, where the total from the integration is recorded into a working memory with its associated value of N(i) and M. The process then continues to decision block 164, where the system determines if the pulse repeat interval index i has reached a maximum value. If not, the process progresses to block 168, where the pulse repeat interval index is incremented, and the process is returned to block 154 to generate a new search value.

If the pulse repeat interval index has reached a maximum value, the process advances to decision block 170. At decision block 170, the system determines if the start delay, M, has reached a maximum value. In the illustrated embodiment, the maximum value of the start delay will be equal to the maximum value of the pulse repeat interval. Other values may be used, however, depending on the known signal properties for a particular application. If the maximum value for the start delay has not been reached, the process continues to block 172, where the start delay value is incremented by one and the pulse repeat interval value is reset to its minimum value. From block 172, the process returns to block 154 to calculate a new search value. If the maximum value of i has been reached, the process proceeds to block 174.

At step 174, the search function reviews the saved search values for peak values. In the example embodiment, all values over a threshold value are considered peaks. Alternatively, one or more maximum signal amplitudes may be selected as peaks. A peak value indicates that a signal having the associated start delay and a periodicity represented by the determined pulse repeat interval has been received at the receiver. This information can be used to recover the signal from a signal buffer or determine the direction of the incoming signal.

Having described the invention, the following is claimed:

1. A method of detecting at least one characteristic of a signal of interest within an input signal, comprising:
   multiplying at least one set of samples from the input signal by at least one set of samples representing a complex conjugate of the input signal to obtain a series of correlation samples;
   summing sets of one or more consecutive correlation samples to obtain a series of pulse sums, each pulse sum having an associated start time;
   integrating a plurality of sets of non-consecutive pulse sums, with the start times of each successive non-consecutive pulse sum in a given set being separated from a preceding pulse sum in the set by an pulse repeat value associated with the set, to obtain respective search values for the plurality of sets of non-consecutive pulse sums;
   selecting an optimal search value as representing a pulse repeat interval for the signal of interest equal to the pulse repeat value separating pulse sums associated with the set of non-consecutive pulse sums represented by the optimal search value; and
   detecting the signal of interest within the input signal according to the determined pulse repeat interval.

2. A method as set forth in claim 1, further comprising the step of accepting the pulse repeat value for the signal of interest if the search value meets a predetermined threshold value.

3. A method as set forth in claim 1, wherein each search value has an associated start delay, based upon the start time associated with a first of the set of non-consecutive pulse sums represented by the search value.

4. A method as set forth in claim 3, wherein the step of summing a plurality of sets of non-consecutive pulse sums is repeated for a series of associated start delays to obtain plurality of search values, each with an associated start delay and pulse repeat interval.

5. A method as set forth in claim 4, further comprising the steps of comparing each search value to a threshold value and accepting the associated values for the start delay and pulse repeat interval as representing characteristics of the signal of interest where the search value exceeds the threshold.

6. A method as set forth in claim 1, wherein the set of input signal samples are derived from the input signal as it is received at a first location, and the set of complex conjugate samples is derived from the input signal as it is received at a second location.

7. A method as set forth in claim 6, wherein the signal of interest, is associated with a signal source, having an associated direction in relation to the first location, and the associated direction is determined from a phase value associated with the input signal.

8. A cross-correlation detection system that detects at least one characteristic of a signal of interest comprising:
   a digital multiplier that multiplies at least one set of samples from the input signal by at least one set of samples representing a complex conjugate of the input signal to obtain a series of correlation samples;
   at least one digital integrator that sums sets of one or more consecutive correlation samples to obtain a series of pulse sums, each pulse sum having an associated start time; and
   a digital signal processor that integratesa plurality of sets of non-consecutive pulse sums, with the start times of each successive non-consecutive pulse sum in a given set being separated from a preceding pulse sum in the set by a pulse repeat value associated with the set, to obtain respective search values for the plurality of sets of non-consecutive pulse sums and selects an optimal search value as representing a pulse repeat interval for the signal of interest equal to the pulse repeat value associated with the set of non-consecutive pulse sums represented by the optimal search value.

9. A system as set forth in claim 8, wherein the digital signal processor accepts the pulse repeat value for the signal of interest if the search value meets a predetermined threshold value.

10. A system as set forth in claim 8, wherein the system is implemented as part of an interferometer that determines the direction of the signal of interest.

11. A computer readable medium encoded with a computer program that is operative in a data processing system, that detects at least one characteristic of a signal of interest within an input signal, the program comprising:

a digital multiplication function that multiplies at least one set of samples from the input signal by at least one set of samples representing a complex conjugate of the input signal to obtain a series of correlation samples;

at least one integration function that sums sets of one or more consecutive correlation samples to obtain a series of pulse sums, each pulse sum having an associated start time; and a search function that integrates a plurality of sets of non-consecutive pulse sums, with the start times of each successive non-consecutive pulse sum in a given set being separated from a preceding pulse sum in the set by a pulse repeat value associated with the set, to obtain respective search values for the plurality of sets of non-consecutive pulse sums and selects an optimal search value as representing a pulse repeat interval for the signal of interest equal to the pulse repeat interval associated with the set of non-consecutive pulse sums represented by the optimal search value.

12. A computer readable medium as set forth in claim 11, wherein the search function accepts the pulse repeat value for the signal of interest if the selected search value meets a predetermined threshold value.

13. A computer readable medium as set forth in claim 11, wherein each search value has an associated start delay, based upon the start time associated with a first of the set of non-consecutive pulse sums represented by the search value.

14. A computer readable medium as set forth in claim 13, wherein the search function repeatedly sums a plurality of sets of non-consecutive pulse sums for a series of associated start delays to produce a plurality of search values, each with an associated start delay and pulse repeat interval.

15. A computer readable medium as set forth in claim 14, wherein the search function compares each search value to a threshold value and accepts the associated values for the start delay and pulse repeat interval as representing characteristics of the signal of interest where the search value exceeds the threshold.

16. A computer readable medium as set forth in claim 11, wherein the set of input signal samples are derived from the input signal as it is received at a first antenna, and the set of complex conjugate samples is derived from the input signal as it is received at a second antenna.

17. A computer readable medium as set forth in claim 16, wherein the signal of interest is associated with a signal source, having an associated direction in relation to the first antenna, and the associated direction is determined from a phase value associated with the input signal.

* * * * *